United States Patent [19]

Comeau

[11] Patent Number: 6,020,788
[45] Date of Patent: Feb. 1, 2000

[54] PHANTON-POWERED ACTIVE DIRECT BOX

[75] Inventor: Richard J. Comeau, Cape Girardeau, Mo.

[73] Assignee: Digital lab Studios, L.L.C., Cape Girardeau, Mo.

[21] Appl. No.: 09/132,108

[22] Filed: Aug. 11, 1998

[51] Int. Cl.[7] .................................................. H03F 3/04
[52] U.S. Cl. ..................................... 330/297; 381/120
[58] Field of Search .................................. 330/297, 301; 381/120, 121, 118, 119, 108

[56] References Cited

U.S. PATENT DOCUMENTS

| | | | |
|---|---|---|---|
| 4,270,151 | 5/1981 | Steinmaier | 360/31 |
| 4,567,608 | 1/1986 | Watson et al. | 381/120 |
| 4,737,735 | 4/1988 | Kampes . | |
| 5,343,159 | 8/1994 | Butler . | |
| 5,459,792 | 10/1995 | Reichel et al. | 381/111 |
| 5,596,648 | 1/1997 | Fast | 381/77 |
| 5,612,646 | 3/1997 | Berning . | |
| 5,731,536 | 3/1998 | Kelsey | 84/736 |

*Primary Examiner*—Robert Pascal
*Assistant Examiner*—Khanh Van Nguyen
*Attorney, Agent, or Firm*—Polster Lieder Woodruff & Lucchesi, L.C.

[57] ABSTRACT

An active direct box comprising an electronic circuit for receiving an unbalanced, high-impedance format audio signal input, and for providing a balanced, low-impedance audio signal output, compatible with common audio system components such as audio consoles and recorders. The direct box circuit receives power from a phantom power source supplied by the audio system component to which the direct box is connected. The phantom power source is isolated, and used to provide a bias supply to a pair of JFET operational amplifiers in the electronic circuit which convert the audio signals, and which provide for both signal gain and signal reduction. A negative feedback system is further employed to covert the input audio signals to a low-impedance format with a minimal introduction of signal distortion.

13 Claims, 1 Drawing Sheet

PHANTON-POWERED ACTIVE DIRECT BOX

CROSS-REFERENCE TO RELATED APPLICATIONS

None.

STATEMENT REGARDING FEDERALLY SPONSORED RESEARCH OR DEVELOPMENT

Not Applicable.

BACKGROUND OF THE INVENTION

The present invention relates generally to audio signal processing components, and more specifically to a "direct box" for coupling instrument audio signals having unbalanced high-impedance formats to audio console inputs designed to receive balanced low-impedance audio signal formats.

Popular musical instruments in common use today, such as electric guitars and acoustic instruments, typically employ a magnetic pickup, a transducer, or a microphone through which sound produced by the instrument is converted into an electrical audio signal for amplification, processing, and recording.

In some musical arrangements, such as on-stage performances, the instrument being played is typically situated at a substantial distance away from the electronic equipment used for amplifying, processing, and recording the audio signals, necessitating a lengthy transmission line. With the exception of a few high-cost professional instruments, most musical devices employ pickups and microphones which are characterized as high-impedance, unbalanced devices, having impedance in the range of 3 k$\Omega$ to 50 k$\Omega$. Compared against the low-impedance balanced microphones found in professional instruments, having impedance on the order of 0.300 k$\Omega$ or less, these high-impedance devices and the lengthy transmission lines connecting them are susceptible to external hum fields and signal noise which can substantially degrade the audio signal quality.

Typical environments contain multiple AC 60-cycle power sources which can produce hum fields. These fields can be introduced into the audio signals through single ended high impedance sources in the audio setup. The degree of hum not only adds to the overall signal noise present in the audio system, but reduces the dynamic range of the audio signals in the system by reducing the signal level difference between the lowest note and the quietest note.

Impedance matching transformers have long been used reduce external hum fields and signal noise over transmission lines by converting electrical audio signals from the high-impedance, unbalanced formats employed by common musical instruments into low-impedance, balanced formats for better audio signal quality, such as is shown in U.S. Pat. No. 5,612,646 to Berning. However, the use of impedance matching transformers has several disadvantages. The transformers necessitate components of a larger physical size and higher cost, as well as suffer from a reduction in dynamic signal ranges, an increase in signal distortion level, and the possibility of noise saturation due to transformer overload. Additionally, a typical transformer coupled direct box cannot respond to the leading edge transients contained in musical audio signals, creating an audible output signal distortion. For example, a musical instrument like the English horn is capable of reaching 60% of its normal peak amplitude in 5 ms. Other instruments can often have rise times that vary from 50 ms to 200 ms, and a hand-clap can rise as fast as 0.5 ms. Typical transformers are not capable of producing an adequate signal response within these short time periods One alternative to an impedance matching transformer includes the use of "direct box" active electronic circuits employing solid-state transistor circuitry or vacuum-tube circuitry to couple the high-impedance instruments directly to the low-impedance audio components. Active electronic devices incorporating vacuum tubes, such as shown in U.S. Pat. No. 5,343,159 to Butler, suffer several disadvantages, including higher manufacturing costs, reliability problems, and an increase in audio signal distortion levels. Similarly, active electronic devices employing solid-state transistor circuitry are typically complex and costly designs, requiring an external AC power source such as a wall outlet, or a battery-type power supply.

Once such device, shown in U.S. Pat. No. 4,737,735 to Kampes for a "Phantom Powered Amplifier" utilizes a non-inverting amplifier and voltage follower circuit. This configuration is a unity-gain stage wherein the feedback from the inverted stage to the output stage is increased to infinity and the feedback is always 100%. The output of this circuit is a unity-gain phase replica of the input voltage, and can degrade the audio signal through excessive feedback. To compensate for this 100% feedback, the '735 patent discloses the use of an input pad floated above electrical ground to reduce input levels to the circuit, and requires additional circuit components.

Accordingly, there is a need in the music industry for a low-cost and reliable direct box audio signal converter which does not induce signal distortions through the use of an impedance matching transformers or vacuum tubes or require the use of an AC power source or battery. Furthermore, a circuit which would allow for adjustment of the feedback gain, either gain reduction or gain increase would greatly improve the quality of the audio signals passing through the circuit.

BRIEF SUMMARY OF THE INVENTION

Among the several objects and advantages of the present invention are:

The provision of an active, direct box capable of coupling unbalanced high-impedance audio signals to balanced low-impedance inputs, without the use of impedance matching transformers and vacuum tubes;

The provision of the aforementioned active direct box which is capable of both signal gain increase and reduction;

The provision of the aforementioned active direct box which does not require connection to an external AC power source such as a wall outlet, or an internal AC or DC power source such as a battery;

The provision of the aforementioned active direct box which receives electrical power from the phantom power source of the associated audio equipment to which it is interconnected;

The provision of the aforementioned active direct box which employs a bipolar operational amplifier with a single voltage power supply;

The provision of the aforementioned active direct box which avoids voltage offsets at the output port, and is accordingly capable of accommodating large output signal swings in relationship to the audio equipment ground level without introducing signal distortion;

The provision of the aforementioned active direct box which eliminates external field hum and signal noise by utilizing out-of-phase signals to cancel external field hum and signal noise;

The provision of the aforementioned active direct box which is capable of responding to rapid input signal rise times; and The provision of the aforementioned active direct box which is easy to manufacture, is low cost, and is reliable.

Briefly stated, the phantom-powered active direct box of the present invention comprises an electronic circuit for receiving an unbalanced, high-impedance format audio signal and for providing a balanced, low-impedance audio signal output compatible with common audio system components such as audio consoles and recorders. The direct box circuitry receives power from a phantom power source supplied by the audio system component to which the box is connected. The power from the phantom power source is isolated and used to provide a bias supply to a pair of JFET operational amplifiers in the electronic circuit which convert the audio signals, and which provide for both signal gain and reduction. A negative feedback system is further employed to covert the input audio signals to a low-impedance format with a minimal introduction of signal distortion.

The foregoing and other objects, features, and advantages of the invention as well as presently preferred embodiments thereof will become more apparent from the reading of the following description in connection with the accompanying drawings.

BRIEF DESCRIPTION OF THE SEVERAL VIEWS OF THE DRAWINGS

In the accompanying drawings which form part of the specification.

Corresponding reference numerals indicate corresponding parts throughout the drawing.

DESCRIPTION OF THE PREFERRED EMBODIMENT

Figure 1:
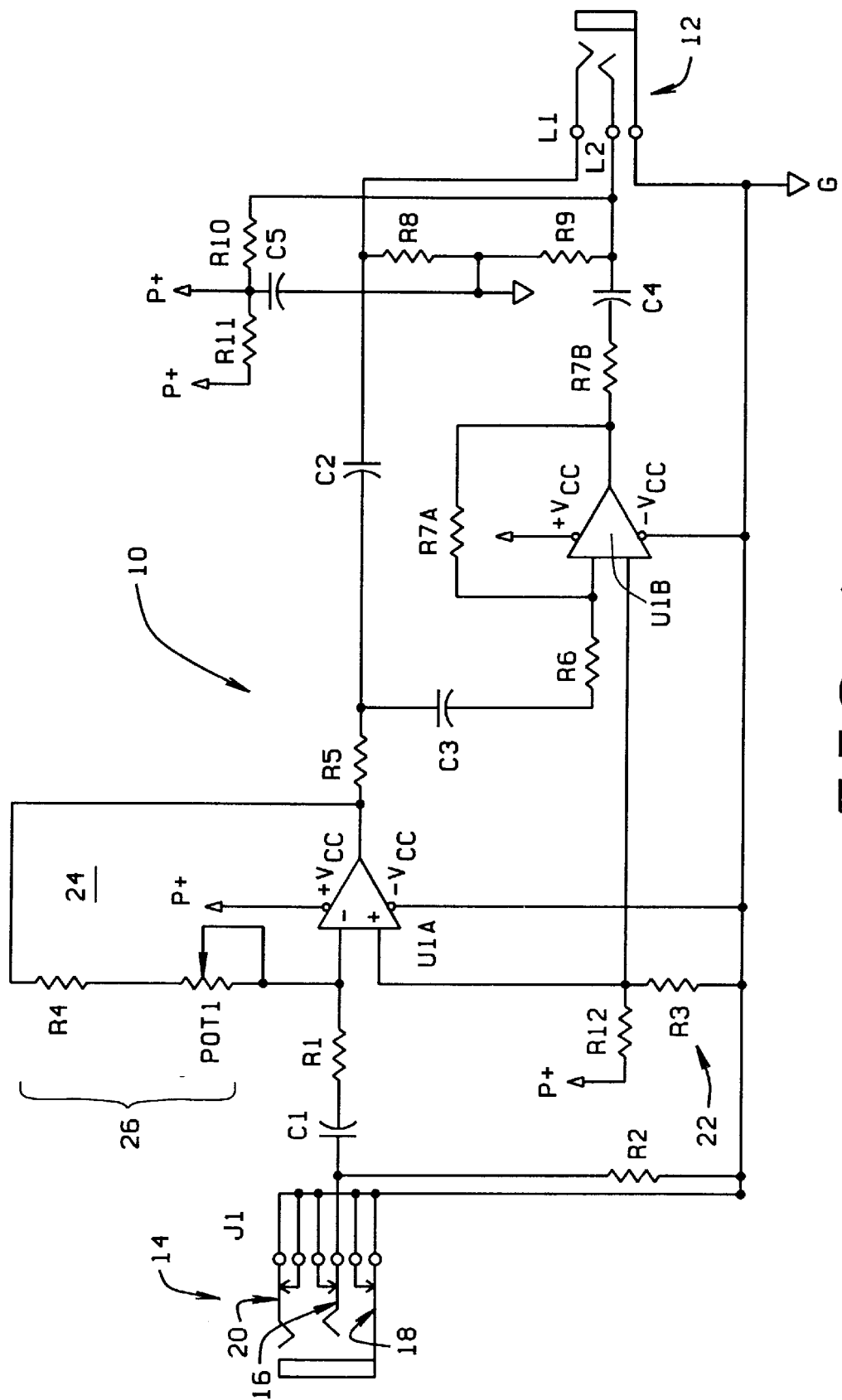
FIG. 1 is a schematic circuit diagram of the phantom-powered active direct box of the present invention.

The following detailed description illustrates the invention by way of example and not by way of limitation. The description will clearly enable one skilled in the art to make and use the invention, describes several embodiments, adaptations, variations, alternatives, and uses of the invention, including what we presently believe is the best mode of carrying out the invention.

Referring to FIG. 1, a preferred embodiment of the electronic circuit of the phantom-powered active direct box of the present invention is shown generally at 10, and comprises a three-line connector 12 having three separate lines, labeled L1, L2, and G for connection to a cable leading to an audio input on an associated audio console (not shown) having a single voltage phantom power supply P+. The connector shown employs spring clips, however, it will be recognized that any compatible type of electrical connector, such as an male or female XLR, or pin-connector, may be used. The audio console provides power to lines L1 and L2, while line G is grounded through the audio console.

Input audio signals are received from a musical instrument or other high-impedance device (now shown) through spring-clip input connector 14 and lead 16. The remaining two leads on the input connector, indicated at 18 and 20, are connected directly to ground line G. A blocking capacitor C1, preferably an audio-grade 100 µf polarized capacitor, blocks any DC components of the audio input signal. Those skilled in the art will recognize that lower grade capacitors, either polarized or non-polarized may be utilized, however, the quality of the audio signal may be adversely affected. The blocking capacitor C1 feeds only the AC components of the audio input signal to the inverted input stage of a JFET operational amplifier U1A. As will be explained below in detail, operational amplifier U1A is preferably one section of a dual-channel JFET operational amplifier, however, those skilled in the art will readily recognize that single-channel operational amplifiers may be employed in this circuit. This AC coupling between the input connector 14 and the operational amplifier U1A insures a long product life and noise-free operations. A bleed resistor R2, preferably a 10 kΩ resistor, is connected to the positive side of capacitor C1 to provide a path to ground line G, so as to create a load impedance to the high impedance musical instrument (not shown) connected at input connector 14.

Prior to reaching the negative input stage of op-amp U1A, the audio input signal first passes through a current limiting resistor R1, preferably 1 kΩ resistor. The positive input stage of op-amp U1A is connected to ground line G through a resistive bridge network 22 comprising resistor R3, preferably a 10 kΩ resistor, floating the op-amp above ground potential. The positive supply pin (+Vcc) on op-amp U1A is connected to the R11 resistor which receives +Vcc electrical power from the single voltage supply source of the phantom power supply (not shown), while the negative supply pin (−Vcc) is connected directly to ground line G. This power source arrangement, and floating ground configuration, permits op-amp U1A to function as if connected to an true bipolar power supply, significantly reducing analog signal distortions created internally within the op-amp due to input voltage swings in relation to ground potential, as compared with the use of an actual single power supply operational amplifier.

The output signal from op-amp U1A is utilized in a feedback loop to create a gain/reduction stage circuit 24. A feedback resistance stage 26, consisting of a fixed resistor R4, preferably a 0.511 kΩ resistor, in series with a variable resistance potentiometer POT1 maintains a minimum amount of signal feedback for the op-amp. Altering the resistance of potentiometer POT1 allows for varying degrees of feedback to op-amp U1A, altering the signal gain. The maximum gain of electronic circuit 10 is limited in proportion by the maximum resistance value of potentiometer POT1. The potentiometer show in FIG. 1 is preferably a 10 kΩ variable resistor, as is required to permit good load driving capabilities into a 0.600 kΩ audio console microphone input port (not shown) with low output signal distortion. Since many musical devices (not shown) have a dynamic output range from 20 mV to 2 Vrms, the adjustable gain provided by potentiometer POT1 allows the gain level on op-amp U1A to be optimized for the signal levels present in any given situation. Large signals may be handled without clipping or excessive distortion, and small signals will not be degraded by pre-amplifier signal noise.

The output signal from op-amp U1A is additionally routed directly to line L1 of connector 12 through resistor R5, preferably a 0.100 kΩ resistor, in series with an isolating capacitor C2, preferably a 100 µf capacitor. This section of the circuit creates an inverted audio signal, utilized to provide a balanced output signal. Resistor R5 isolates the output signal of operational amplifier U1A from the audio console. Capacitor C2 isolates the AC output of op-amp U1A from the DC phantom power P+ on line L1.

The output signal from op-amp U1A routed through resistor R5 is additionally provided to the negative input stage of a second operational amplifier U1B through a capacitor C3, preferably an audio-grade 100 µf polarized capacitor and resistor R6, preferably 10 kΩ, connected in series, to re-invert the signal originally inverted by op-amp U1A. Capacitor C3 and resistor R6 serve to isolate the AC input of op-amp U1B from any DC voltages, and to reduce the signal level. As with op-amp U1A, the positive input stage of op-amp U1B is connected to ground line G through resistive bridge network 22, floating the op-amp above ground potential. Similarly, the positive supply pin (+Vcc) on op-amp U1B is connected to same single voltage supply source of the phantom power supply (not shown) as that of op-amp U1A, while the negative supply pin (-Vcc) is connected directly to ground line G. Those skilled in the art will recognize that if op-amps U1A and U1B are separate channels of a dual-channel op-amp, as in the preferred embodiment, each will share a positive supply pin (+Vcc). If separate op-amp circuits are utilized, additional isolating circuit components must be utilized on the power supply line to ensure proper stability.

Connected in a negative feedback configuration, the output of op-amp U1B is returned to negative input stage of the op-amp through resister RA7, preferably a 13 kΩ resistor. Additionally, the output of op-amp U1B is passed through a signal level reducing resistor R7B, preferably 0.100 kΩ and isolating capacitor C4, preferably an audio-grade 100 µf polarized capacitor, to line L2 of connector 12.

A pair of output resistors, R8 and R9, each preferably 10 kΩ, are connected between lines L1 and L2, and to ground line G, to provide a load on capacitors C2 and C4 and provide for proper signal flow through them. The DC voltage of line L2 is routed through resistor R10, preferably 0.511 kΩ, and the AC components are filtered to ground line G through capacitor C4, preferably 4.7 µf, providing filtered DC phantom power P+ for the +Vcc input pins of op-amps U1A and U1B, and through resistors R11 and R12, both preferably 10 kΩ. Capacitor C4 maintains a charge to drive op-amps U1A and U1B during dynamic musical passages, as the phantom current supplied by the audio console is minimal. Resistor R12 forms part of the resistive bridge network 22, and provides a voltage which raises the voltage above the ground reference point on ground line G.

Op-amps U1A an U1B preferably comprise channels A and B, respectively, of a dual-channel JFET operational amplifier integrated circuit having input impedance of $10^{12}$ power. This high input impedance aids in insuring a reduced load on the input musical device such as a guitar or keyboard (not shown) to which the electronic circuit 10 is connected. The dual-channel op-amp preferably has a 4 MHz unity-gain bandwidth, reduced in the electronic circuit 10 to a flat 100 kHz response while achieving a maximum gain and reduction of ±10 dB. With a flat frequency response on the order of 100 kHz, electronic circuit 10 is able to pass higher order harmonics which exceed the normal audio frequency range of 20 Hz to 20 kHz. Furthermore, JFET integrated circuits are capable of immediate response to any input transient signals, thus insuring delay distortion effects, such as seen in transformer-coupled direct boxes, do not occur.

The dual-channel JFET accepts a maximum bipolar supply voltage of ±18 volts DC The input differential voltage directly relates in maximum signal amplitude to the total peek supply voltage applied to the circuit from the single voltage phantom power source of the audio console. If however, the maximum differential input voltage exceeds the potential of the floated negative power supply, distortion will occur in the audio output signal. By employing a JFET operational amplifier having a large breakdown voltage from the gate to the source and drain, the need for clamps across the amplifier inputs is eliminated, improving the overall audio signal dynamics achieved through electronic circuit 10. Furthermore, large differential input voltages from the input musical device may be accommodated without a corresponding large increase in input current.

One skilled in the art of electronic circuit design will recognize that operation amplifiers other than the JFET dual-channel op-amp described above could be utilized in electronic circuit 10, however, there will be a different maximum supply voltage range, as well as other variations in the specific technical specification which could result in a change in the potential input voltage swing, adding distortion to the audio output signal. For example, utilizing a reduced audio quality, single power supply op-amp, the analog distortions created internally by any active circuitry would dramatically increase. Furthermore, non-bipolar devices have limited fundamental circuit characteristics needed for an advanced audio circuit, such as slew rate, open-loop gain, and frequency response.

During use, electronic circuit 10 is interconnected between a high impedance musical instrument or other input device such as a microphone, and a audio console or recording device adapted to provide a phantom power source and to receive low impedance inputs. The phantom power source of the audio console is utilized by the electronic circuit to create a virtual bipolar power supply voltage for the JFET op-amps U1A and U1B. This is achieved by floating the electronic circuit above electrical ground by means of resistive bridge network 22. The resistive bridge network, connected between the positive input stage of each op-amp and ground line G, lifts the internal circuitry of the op-amps and following circuit components above ground. Accordingly, each op-amp U1A and U1B, connected between the single voltage positive supply source P+ and ground line G, views the phantom power supply as if it were an actual bipolar power supply. This allows analog distortions created internal to electronic circuit 10 due to swings between the input signal voltage and a physical ground of a bipolar power supply to be dramatically reduced.

In view of the above, it will be seen that the several objects of the invention are achieved and other advantageous results are obtained. As various changes could be made in the above constructions without departing from the scope of the invention, it is intended that all matter contained in the above description or shown in the accompanying drawings shall be interpreted as illustrative and not in a limiting sense.

I claim:

1. An impedance matching electronic circuit for connection to a current carrying line, comprising:

a first connector for receiving DC power from said current carrying line and providing AC signals to said current carrying line;

a second connector for receiving AC signals;

an amplifier circuit having an input for receiving AC signals from said second connector and having a pair of outputs for providing AC signals to said first connector, said amplifier circuit floated above an electrical ground reference;

means for extracting a single positive voltage from said DC power to bias said amplifier circuit including means for isolating said DC power from said amplifier circuit output, a supply line connected to said first connector, and means for isolating said supply line from AC signals; and a resistive bridge network interconnected between said isolated supply line, said amplifier circuit, and said electrical ground reference, said resistive bridge network configured to raise the electrical potential of said amplifier circuit above said electrical ground reference.

2. The impedance matching electronic circuit of claim 1 wherein said first connector includes:

a grounded conductor for establishing said electrical ground reference; and first and second conductors for carrying said DC power, wherein said supply line is connected to said first and second conductors, and wherein said amplifier circuit provides inverted and non-inverted AC signals, respectively, to said conductors.

3. The impedance matching electronic circuit of claim 2 wherein said means for isolating said DC power from said amplifier circuit output includes capacitive circuit elements connected between said amplifier circuit output and said conductors.

4. The impedance matching electronic circuit of claim 2 wherein said means for isolating said supply line from AC signals comprises a capacitive circuit element connected between said supply line and said grounded conductor.

5. The impedance matching electronic circuit of claim 2 wherein said amplifier circuit comprises:

a first amplifier having an inverting stage input for receiving AC signals from said secon connector and for producing first negative polarity output signals; and a second amplifier having an inverting stage input for receiving said first output signals, said second amplifier being an inverting amplifier and producing a second non-inverted output signal, said first output signal being connected to said first conductor, and said second output signals being connected to said second conductor.

6. The impedance matching electronic circuit of claim 5 wherein said first amplifier includes a feedback resistance stage connecting said first output signals to said first amplifier negative stage input, said feedback resistance stage including a variable resistance potentiometer for altering a level of feedback to said first amplifier.

7. The impedance matching electronic circuit of claim 6 wherein said feedback resistance stage further includes a resistive element in series with said variable resistance potentiometer, said resistive element providing a minimum level of feedback.

8. The impedance matching electronic circuit of claim 5 wherein said second amplifier is connected in a negative feedback configuration with a resistive element connecting said second output signal to said second amplifier negative state input.

9. The impedance matching electronic circuit of claim 5 wherein said first and second amplifiers are bipolar powered JFET operational amplifiers.

10. The impedance matching electronic circuit of claim 5 wherein said first and second amplifiers comprise first and second channels of a dual-channel JFET operational amplifier.

11. The impedance matching electronic circuit of claim 5 wherein said resistive bridge network interconnects said isolated supply line and the positive stage inputs on said first and second amplifiers.

12. The impedance matching electronic circuit of claim 11 wherein said resistive bridge network comprises a first resistive element interconnected between said isolated supply line and said positive stage inputs, and a second resistive element interconnected between said positive stage inputs and said grounded conductor.

13. An apparatus for receiving an unbalanced AC signal from an input device and providing a balanced AC signal to an output device which provides phantom power, comprising:

an bipolar powered amplifier means for receiving said unbalanced AC signals and providing gain-adjusted balanced inverted and non-inverted outputs;

means for receiving said phantom power and isolating said phantom power from said amplifier means;

at least one capacitive circuit filtering AC components from said isolated phantom power; and means for providing a single positive voltage from said filtered and isolated phantom power from said capacitive circuit to bias inputs of said amplifier means and to float said amplifier means above an electrical ground reference point.

* * * * *

UNITED STATES PATENT AND TRADEMARK OFFICE
CERTIFICATE OF CORRECTION

PATENT NO. : 6,020,788
DATED : February 1, 2000
INVENTOR(S) : Richard J Comeau

It is certified that error appears in the above-identified patent and that said Letters Patent is hereby corrected as shown below:

On title page, item 54 TITLE
  replace "PHANTON-POWERED ACTIVE DIRECT BOX"
  with --PHANTOM-POWERED ACTIVE DIRECT BOX--.

Col. 5, line 28
  replace "RA7"
  with --R7A--.

Signed and Sealed this

Twenty-first Day of November, 2000

Attest:

Q. TODD DICKINSON

*Attesting Officer*   *Director of Patents and Trademarks*